(12) United States Patent
Lin

(10) Patent No.: US 6,720,836 B2
(45) Date of Patent: Apr. 13, 2004

(54) CMOS RELAXATION OSCILLATOR CIRCUIT WITH IMPROVED SPEED AND REDUCED PROCESS TEMPERATURE VARIATIONS

(75) Inventor: Xijian Lin, Fremont, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 10/201,410

(22) Filed: Jul. 22, 2002

(65) Prior Publication Data

US 2003/0111669 A1 Jun. 19, 2003

Related U.S. Application Data

(60) Provisional application No. 60/341,481, filed on Dec. 14, 2001.

(51) Int. Cl.[7] .............................................. H03K 3/282
(52) U.S. Cl. ...................................... 331/143; 327/111
(58) Field of Search ............................... 327/101, 278, 327/100; 331/176, 111, 143, 144

(56) References Cited

U.S. PATENT DOCUMENTS 6,157,270 A * 12/2000 Tso ............................ 331/176
6,377,129 B1 * 4/2002 Rhee et al. .................. 331/111
6,404,258 B2 * 6/2002 Ooishi ......................... 327/278

OTHER PUBLICATIONS

Maneatis, John G., IEEE Journal of Solid State Circuits, "Low-Jitter Process-Independent DLL and PLL Based on Self-Biased Techniques," vol. 31, No. 11, pp. 1723-1732 (Nov. 1966).

* cited by examiner

Primary Examiner—Dinh T. Le
(74) Attorney, Agent, or Firm—Fliesler Meyer LLP

(57) ABSTRACT

An improved relaxation oscillator circuit is provided using conventional CMOS device shunted with a current source (101 and 103) at each load of two cross-coupled gain stages. The improved oscillator uses a clamp voltage reference (134), to control the voltage swing across the charging/discharging capacitor (118). The improvements provide improved speed to power ratio, increased frequency tuning range, and less process and temperature variation effects. A transistor (130) and current source (138) replicate output transistors (110, 114) and current sources (101, 103). An amplifier (132) receives a clamp voltage reference (134) and current from the transistor (130) and current source (138) and functions to provide necessary drive currents to the gates of transistors (110, 114) which drive the outputs (VOR, VOL).

21 Claims, 4 Drawing Sheets

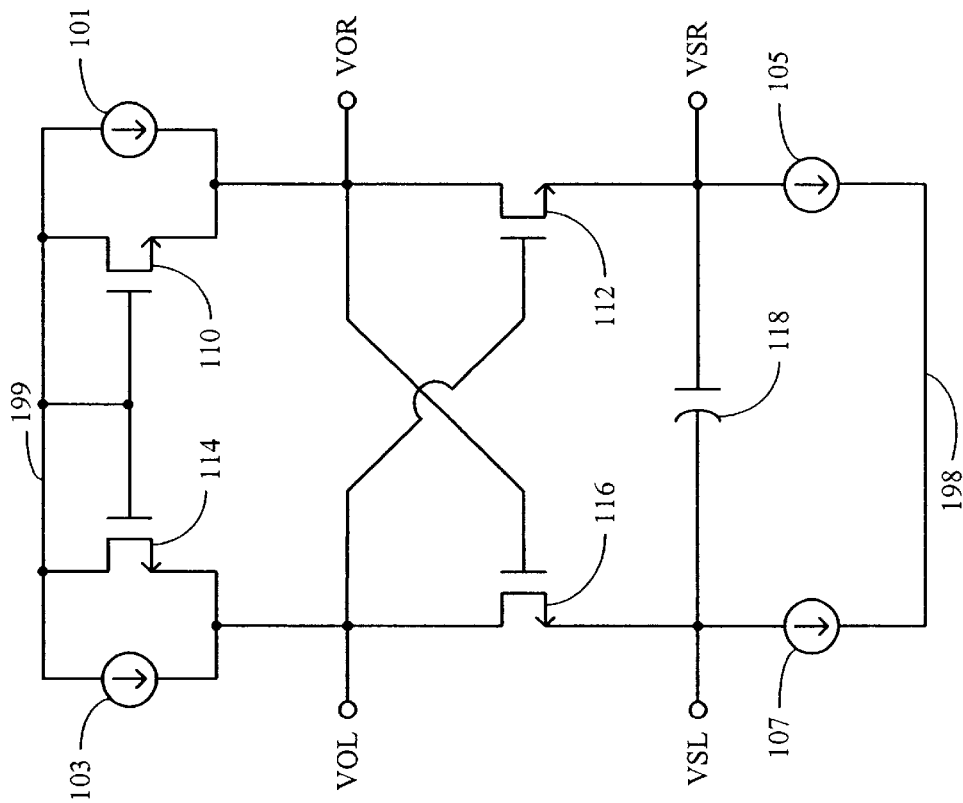
FIG. 1 - PRIOR ART

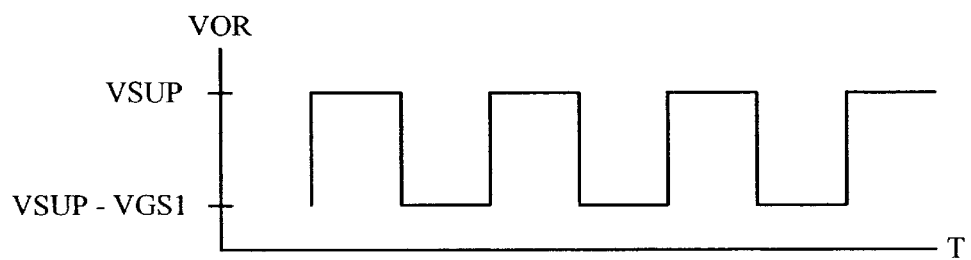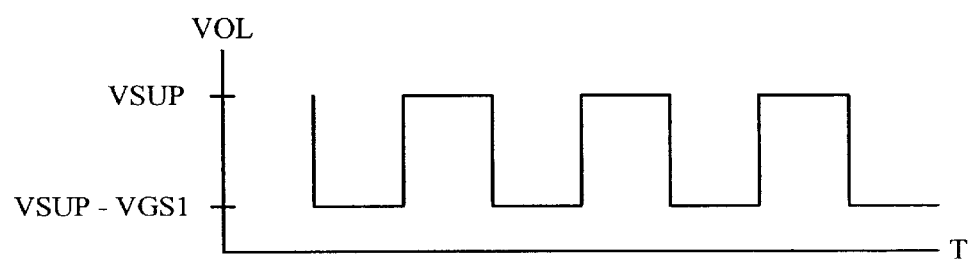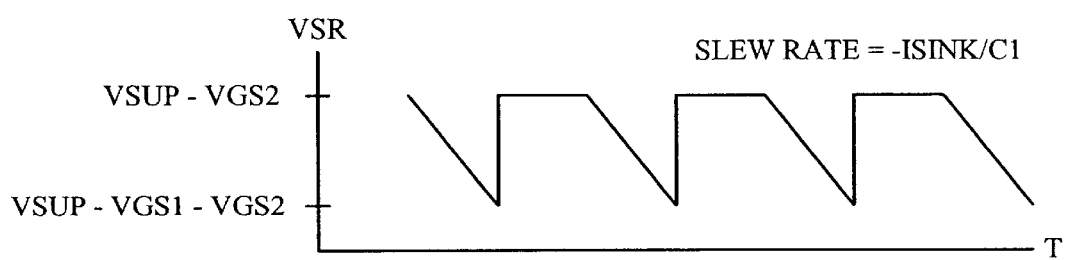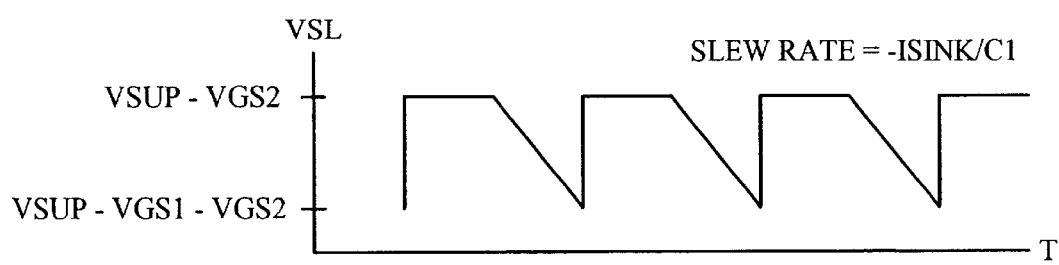
FIG. 2 - PRIOR ART

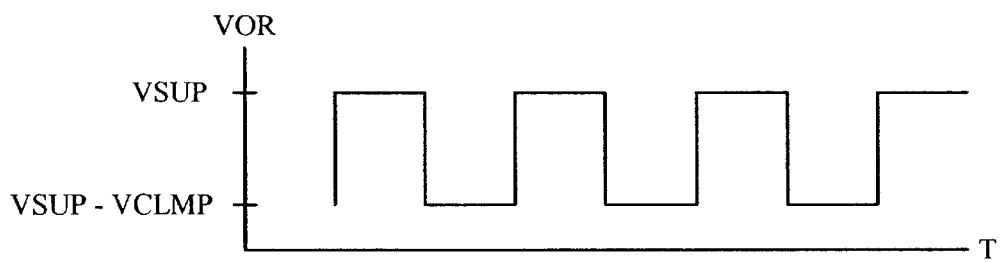
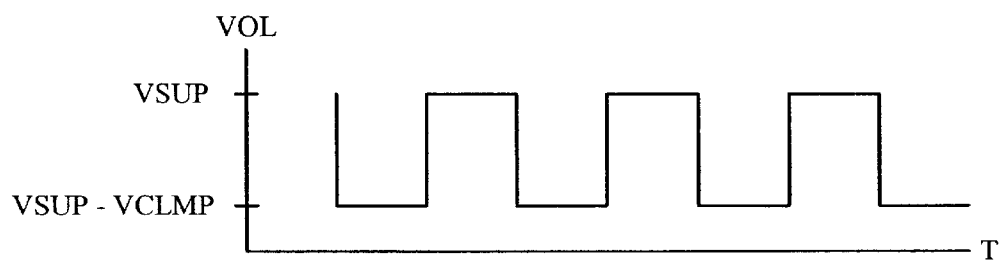
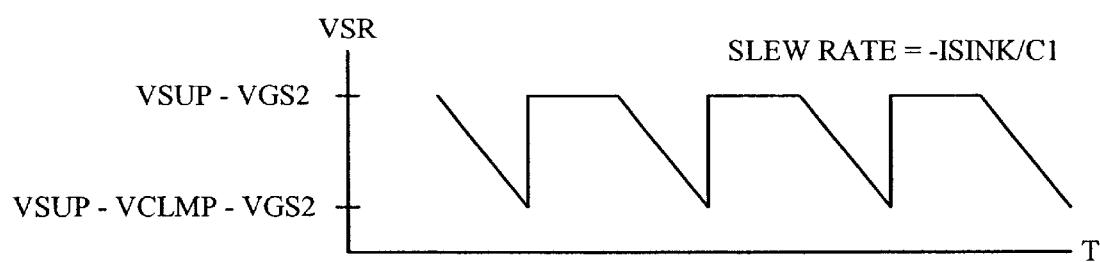
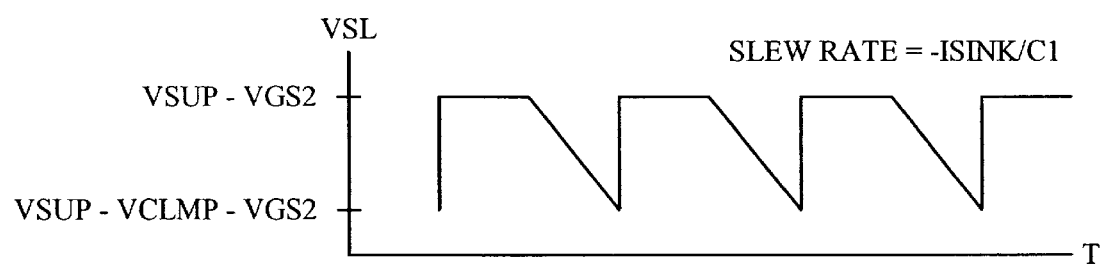
FIG. 4

CM OS RELAXATION OSCILLATOR CIRCUIT WITH IMPROVED SPEED AND REDUCED PROCESS TEMPERATURE VARIATIONS

CLAIM OF PRIORITY

This application claims priority from provisional application entitled "A CMOS Relaxation Oscillator Circuit with Improved Speed and Reduced Process/Temperature Variations", Application No. 60/341,481, filed Dec. 14, 2001.

BACKGROUND

1. Technical Field

This invention relates to CMOS relaxation oscillator circuits. More particularly, this invention relates to high speed CMOS relaxation oscillator circuits with reduced dependence on process and temperature variations.

2. Background

Oscillators are widely used throughout the microelectronics industry to provide a steady and stable periodic output waveform. For example, a typical oscillator could be used to generate the clock signals for digital applications. Another application where oscillator circuits are used is in the generation of an amplitude modulated carrier signal or a frequency modulated carrier signal for the transmission of data.

Oscillator circuits are generally broken down into two subclasses: tuned oscillators and relaxation oscillators.

Tuned oscillators have the advantage of high frequency stability, high frequency capability and higher spectral purity than relaxation oscillators. Tuned oscillators, however, require expensive and bulky components, such as inductors and crystals. Furthermore, these components are difficult to integrate into monolithic circuits. Additionally, tuned oscillators suffer from a narrow frequency band of operation.

Relaxation oscillators, however, have some unique advantages when used in integrated circuit design. For instance, relaxation oscillators do not require inductors or crystals. Thus, the relaxation oscillator can be easily incorporated into monolithic circuits. Additionally, the operative frequency band of a relaxation oscillator circuit is proportional to a charging current and inversely proportional to a voltage level across an energy storage device (e.g. capacitor) and the energy storage capacity of the energy storage device. The frequency of the relaxation oscillator circuit can easily be set using a single external component (e.g. a resistor) and can be varied linearly over a wide frequency band. A relaxation oscillator circuit, however, suffers from relatively poor frequency stability, particularly for high-speed operation. Furthermore, the relaxation oscillator circuit has a poor spectral purity characteristic.

BRIEF DESCRIPTION OF THE DRAWINGS

Further details of the present invention are explained with the help of the attached drawings.

FIG. 1 depicts a relaxation oscillator circuit found in the prior art.

FIG. 2 depicts the voltage waveforms within the prior art relaxation oscillator circuit during the transitions between the two stable states.

FIG. 4 depicts the voltage waveforms within the improved relaxation oscillator circuit depicted in FIG. 3.

DETAILED DESCRIPTION

Figure 3:
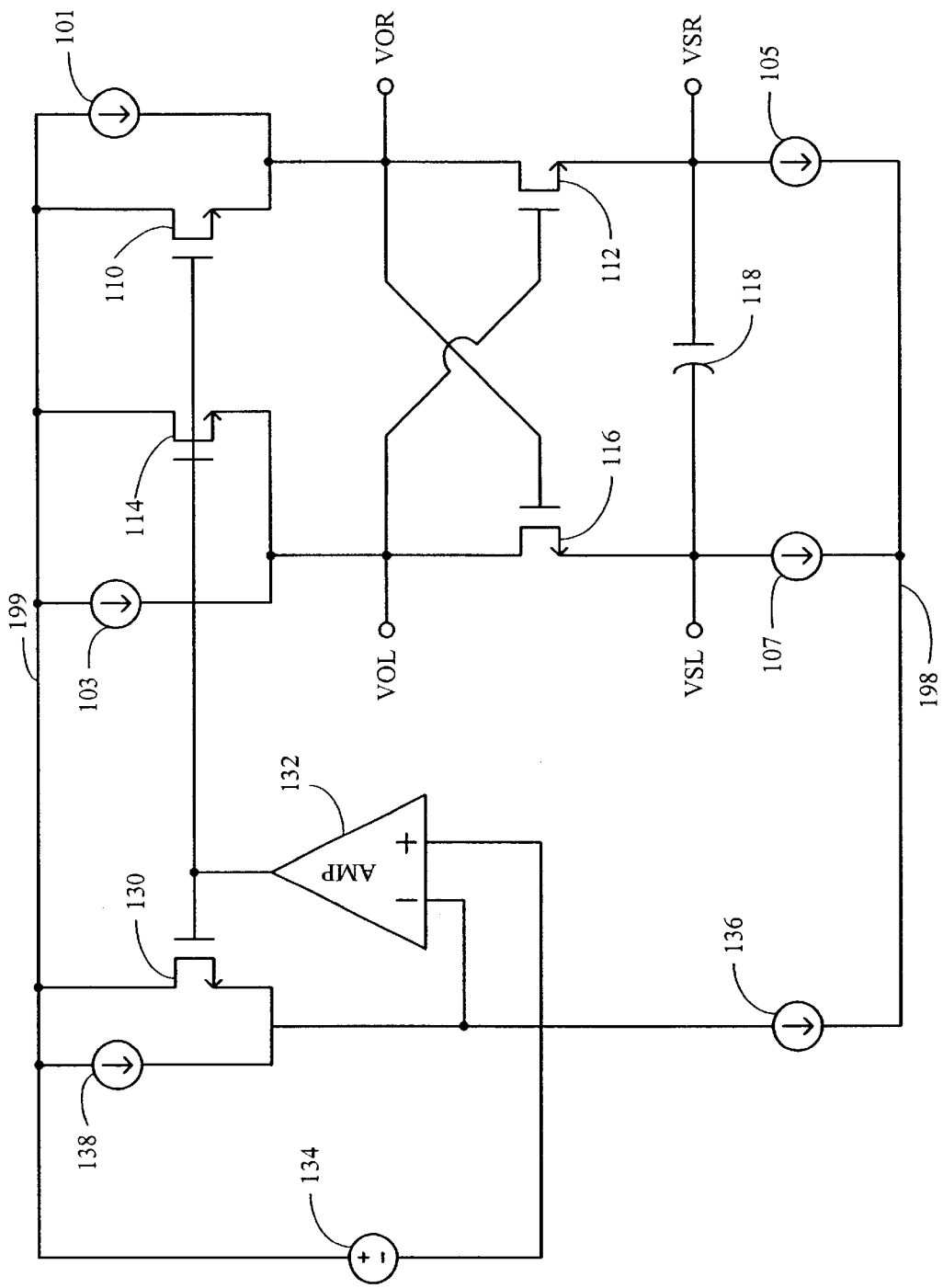
FIG. 3 depicts an improved relaxation oscillator circuit with improved speed and reduced dependency on process and temperature variations.

FIG. 1 depicts a relaxation oscillator circuit found in the prior art. The circuit is biased with a first voltage source 199 at a voltage potential of VSUP, and a second voltage source 198 at a voltage potential of VSUP2. The first voltage source 199 has a higher voltage potential than the voltage potential of the second voltage source 198 (VSUP>VSUP2). The value of VSUP2 can be zero volts. Connected between the first voltage source 199 and the second voltage source 198 is a right side of the relaxation oscillator circuit and a left side of the relaxation oscillator circuit.

The right side of the relaxation oscillator circuit includes a current source 101 connected in parallel with a diode connected transistor 110. Thus, a drain and a gate of the transistor 110 are connected together as well as being connected with the first voltage source 199. A first terminal of the current source 101 is connected to the first voltage source 199. The current source 101 is connected in such a manner as to source current in a direction that is generally from the first voltage source 199 and towards the second voltage source 198. A source of the transistor 110, a second terminal of the current source 101, a drain of a transistor 112, and the gate of a transistor 116 are connected together to form a first node, VOR. A source of the transistor 112 is connected with a first terminal of a capacitor 118 and a first terminal of a current sink 105 to form a second node, VSR. The second terminal of the current sink 105 is connected with the second voltage source 198, such that current flows into the second voltage source, 198.

The left side of the relaxation oscillator circuit essentially mirrors the right side of the relaxation oscillator circuit. Thus, the left side of the relaxation oscillator circuit includes a current source 103 connected in parallel with a diode connected transistor 114. Thus, a drain and a gate of the transistor 114 are connected together as well as being connected with the first voltage source 199. Additionally, the gate of the transistor 114 is connected with the gate of the transistor 110. A first terminal of the current source 103 is connected with the first voltage source 199. The current source 103 is connected in such a manner as to supply current in a direction that is generally from the first voltage source 199 towards the second voltage source 198. A source of the transistor 114, a second terminal of the current source 103, a drain of a transistor 116, and a gate of the transistor 112 are connected together to form a third node, VOL. A source of the transistor 116 is connected with a second terminal of the capacitor 118 and a first terminal of a current sink 107 to form a fourth node, VSL. A second terminal of the current sink 107 is connected with the second voltage source 198, such that current flows into the second voltage source 198.

The current sink 105 and the current sink 107 sinks current from a first gain stage that includes the transistor 112 and a second gain stage that includes the transistor 116. Additionally, the current sink 105 is typically set to sink the same amount of current as the current sink 107 and has a current value of ISINK.

The current source 101 and the current source 103 are non-ideal. Thus, they both have a zero amp output current when the voltage across their terminals is zero. If the voltage across their terminals is not zero, then the value of the current can be any arbitrary number from zero amps to two times ISINK. Typically, the current provided by the current source 101 is equal to the current provided by the current source 103 and has a current value of ISOURCE. Furthermore, ISINK is typically equal to ISOURCE.

For simplicity, the ratio of the transistor width to the transistor length is balanced along the different stages of the relaxation oscillator circuit. Thus, the width-to-length (W/L) of the transistor 110 is approximately equal to the W/L of the transistor 114. Likewise, the W/L of the transistor 112 is approximately equal to the W/L of the transistor 116. Thus, W/L(112)=W/L(116) and W/L(110)=W/L(114). Consequentially, the gate to source voltage, VGS, drop across the transistor 110 when it is on is equal to the VGS drop of the transistor 114 when it is on. The VGS associated with the transistor 110 or the transistor 114 is referred to as VGS1. Furthermore, the VGS drop across the transistor 112 when it is on is equal to the VGS drop of the transistor 116 when it is on. The VGS associated with the transistor 112 or the transistor 116 is referred to as VGS2.

In operation, the cross-coupling between the transistor 112 and the transistor 116 by the capacitor 118 creates a positive feedback around the loop of the two gain stages. Thus, the relaxation oscillator circuit will oscillate and the voltage amplitude of an output signal on the output nodes, VOL and VOR, will grow until the output signal is clipped. At any one time, it can be assumed that either the transistor 112 or the transistor 116 will be active, but not both. Thus, the capacitor 118 is alternatively charged with equal but opposite currents. One current that charges the capacitor 118 originates from the transistor 112 when it is active and another current originates from the transistor 116 when it is active. The source of the charging current for the capacitor 118 alternates in half cycles of the relaxation oscillator circuit operation.

During one half cycle of the relaxation oscillator circuit operation, the transistor 116 is supposed to be off and the transistor 112 is on. Meanwhile, the voltage at the third node, VOL, is equal to the voltage potential of the first voltage source 199, or [VOL=VSUP]. The first node, VOR, however, is clamped to a voltage potential equal to the first voltage source199, less VGS1, the gate to source voltage drop across the transistor 110, or [VOR=VSUP-VGS1]. The source current of the transistor 110 is equal to the sum of the current sink 105 and the current sink 107 less the current source 101, or [2*ISINK-ISOURCE=ISINK]. The transistor 112 is conducting a current equal to the sum of the current sink 105 and the current sink 107 or [2*ISINK]. The voltage at the second node, VSR, is clamped to the voltage at the third node, VOL, less VGS2, the gate to source voltage of the transistor 112 or [VSR=VOL-VGS2=VSUP-VGS2]. It can be assumed that at the beginning of the half cycle, the voltage at the fourth node, VSL, is equal to the voltage at the node of VSR. Since the transistor 116 is off and the transistor 112 is on with a current of 2*ISINK, there is a current of ISINK flowing from the node VSR to the node VSL. The charging current through the capacitor 118 will cause the voltage level at the node, VSL, to ramp down with a constant slew rate of ISINK/C1, where C1 is the capacitance value of the capacitor 118. When this voltage ramps to [VSUP-VGS1-VGS2], the transistor 116 is turned on like a switch. At this point, the positive feedback around the loop of the two stages will force the transistor 112 to be off like a switch. The output voltage at the third node, VOL, will be pulled down to VSUP-VGS1 and the output voltage of the first node, VOR, is regenerattively pulled up to VSUP. The voltage at the node VSL is restored to be [VSUP-VGS2]. As a result, the circuit has now changed its state and the capacitor 118 discharges in the opposite direction with a constant current equal to ISINK. The circuit maintains this state until the voltage level at the source of the transistor 112 ramps downward to [VSUP-VGS1-VGS2], causing the transistor 112 to turn on and switch the circuit to its prior state, whereby the cycle repeats itself.

FIG. 2 depicts the voltage waveforms within the prior art relaxation oscillator circuit during transitions between two stable states. The voltage level at the source of the off-transistor (transistor 116 or 112, which is off) is linearly ramping in a negative direction with a slew rate of ISINK/C1, for a total voltage swing of (VSUP-VGS2)-(VSUP-VGS1-VGS2)=VGS1 during each half-cycle. Recall that VGS1 is the gate to source voltage across either transistor 110 or transistor 114, whichever is on. Each half-cycle of oscillation is equal to the time T/2 for the voltage across capacitor 118 to ramp down by an amount equal to VGS1. Thus, T/2=C1*VGS1/ISINK. The total period of oscillation is T and the frequency of oscillation can be expressed as [F=1/T=ISINK/(2*C1*VGS1)]. Thus, the frequency is proportional to the charging current of ISINK, and is inversely proportional to the value of the timing of capacitor 118 and VGS1, which is the voltage across the diode connected transistors, transistor 110 and transistor 114 when they are on with a source current of ISOURCE=ISINK, and the voltage swing across the capacitor 118.

By neglecting the body effect of the transistors for simplicity, VGS1 can be expressed as VGS1=Vt0+((2*ISINK/k)^½). In this equation, Vt0 is the threshold voltage and k is the device transconductance of either transistor 110 or transistor 114, depending on which transistor is conducting. Both Vt0 and k are determined by the process used for the design of the relaxation oscillator circuit. The frequency dependence on VGS1 prevents the use of ISINK to compensate for process and temperature variations. Thus, the frequency will be unstable over process and temperature. Additionally, VGS1 has a minimum value of Vt0 when ISINK is zero. Consequentially, a certain amount of current, ISINK, is required for a minimum operating frequency. Moreover, VGS1 increases linearly in proportion to the square root of ISINK. This relationship between VGS1 and ISINK forces the oscillator to need more charging current for higher speed operation due to the increased signal swing.

FIG. 3 depicts modifications to the circuit of FIG. 1 to create an improved relaxation oscillator circuit with improved speed and reduced dependency on process variations and temperature. Components carried over from FIG. 1 to FIG. 3 are similarly labeled for convenience. In FIG. 3, the transistor 110 and the transistor 114 are no longer diode connected. Thus, the gate of these two transistors are not connected with the voltage source 199. Rather, the gate of transistor 110 is connected with the gate of transistor 114, the gate of an additional transistor 130 and the output of an amplifier 132. In addition to the previously identified connections to the voltage source 199, the drain of the transistor 130, a first terminal of a current source 138, and a first terminal of voltage source 134 are connected to the voltage source 199. A second terminal of current source 138 is connected with the source of the transistor 130, an inverting input to the amplifier 132, and a first terminal of a current sink 136. A second terminal of voltage source 134 is connected to a non-inverting input to amplifier 132. Lastly, a second terminal of current sink 136 is connected to the voltage source 198.

The reference voltage source 134, the amplifier 132 together with the transistor 130, the current source 138 and the current sink 136 provide proper biasing for the gates of the transistor 114 and the transistor 110. The current source 138 has the same properties as the current source 103 and the current source 101. Thus, the current source 138 is non-ideal and requires a voltage across its terminals for it to generate a current. Also, current source 138 provides the same current as the current source 103 and the current source 101, that being ISOURCE. The current sink 136 provides a current equal to two times ISINK or [2*ISINK]. The voltage source 134 has a voltage value of VCLMP. Lastly, the W/L ratio of the transistor 130 is equal to W/L ratio of the transistor 114 and the transistor 110, [W/L(130)=W/L(114)=W/L(110)].

The relaxation oscillator circuit of FIG. 3 performs similarly to the relaxation oscillator circuit of FIG. 1, with a few exceptions. For instance, the value of voltage source 134, VCLMP, now controls the voltage at the node VOR to be VSUP−VCLMP when transistor 112 is on (same for the voltage at the node VOL when transistor 116 is on), rather than the gate-to-source voltage drop of the transistor 110 setting the voltage at the node VOR to be VSUP−VGS1 (same for the node VOL). As the circuit settles, the voltage difference between the non-inverting and the inverting terminals of the amplifier 132 seek equilibrium. Thus, the voltage at the source of the transistor 130 settles to a value equal to VSUP−VCLMP. The voltage on the gate and source of transistor 114 and transistor 110 (when they are on) mirror the voltage values on the gate and source of the transistor 130, to make VOR=VSUP−VCLMP and VOL=VSUP−VCLMP.

While the transistors shown in FIG. 3 are NMOS transistors, these transistors can be replaced with PMOS transistors. Thus, a drain-source current path is formed in the transistors. Current in the drain-source path is controlled at a transistor control input (e.g. transistor gate). Furthermore, the transistors shown in FIG. 3 can be BJT transistors, either npn BJTs or pnp BJTs. If BJTs are used, then a collector-emitter path is formed. Current in the collector-emitter path is set using a transistor control input (e.g. transistor base). Collectively, a transistor can be described as comprising a first terminal coupled with a second terminal and a control terminal coupled between the first terminal and the second terminal.

FIG. 4 depicts the voltage waveforms within the improved relaxation oscillator circuit depicted in FIG. 3. In operation, the voltage at the first node, VOR, varies between VSUP and (VSUP−VCLMP); the voltage at the second node, VSR, varies between (VSUP−VGS2) and (VSUP−VCLMP−VGS2); the voltage at the third node, VOL, varies between VSUP and (VSUP−VCLMP); and, the voltage at the fourth node, VSL, varies between (VSUP−VGS2) and (VSUP−VCLMP−VGS2). Furthermore, the voltage at node VSR and the node VSL continue to ramp down with a slew rate of ISINK/C1, where C1 is the value of capacitor 118. From these voltage characteristics of the relaxation oscillator circuit in FIG. 3, it can be seen that the voltage source 134 with a value of VCLMP can be used to control the voltage variation on node VOR and node VOL. Also, each half-cycle of oscillation is equal to the time T/2 for the voltage across capacitor 118 to ramp down by a voltage equal to VCLMP, or T/2=C1*VCLMP/ISINK. Thus, the total period of oscillation is T and the frequency of oscillation can be expressed as F=1/f=ISINK/(2*C1*VCLMP). Hence, the frequency is proportional to the charging current of ISINK, and inversely proportional to the value of the timing capacitor 118 and the voltage swing across the capacitor, VCLMP.

The value of VCLMP can be designed to be less than the threshold voltage, Vt0, therefore less than the VGS1 of the relaxation oscillator circuit depicted in FIG. 1 for any charging current ISINK. Thus, the improved relaxation oscillator circuit of FIG. 3 will have a higher speed than the relaxation oscillator circuit of FIG. 1 for the same charging current ISINK and the same timing capacitor 118. Another way to describe the improvement is to say that for the same speed and capacitor, the improved relaxation oscillator circuit of FIG. 3 consumes less current than the relaxation oscillator circuit of FIG. 1. The amplifier 132 can also be designed to have a higher supply voltage than the voltage source 199, or VSUP. Hence, the amplifier output can exceed the voltage source 199; and, the gate voltage of the transistor 110, the transistor 114 and the transistor 130 can also be higher than the value of the voltage source 199, or VSUP.

In addition to the above-described improvements, the value of VCLMP is independent of the value of ISINK. Hence, the frequency increases linearly with ISINK in the relaxation oscillator circuit of FIG. 3 rather than increasing with the square root of ISINK as the relaxation oscillator circuit of FIG. 1 behaves. Consequentially, the frequency tuning range of the relaxation oscillator circuit of FIG. 3 is improved over the prior art.

The value of VCLMP allows a frequency to be stable irrespective of process and temperature variations. Thus, voltage source 134 can be a neighboring circuit on an integrated circuit that includes the relaxation oscillator circuit of FIG. 3. Additionally, the value of VCLMP can be set such that it is proportional to a reference voltage (Vref) on an integrated circuit that includes the relaxation oscillator circuit of FIG. 3. For instance, VCLMP can be proportional to a bandgap voltage. Furthermore, VCLMP can equal k times Vref, where k is constant. Moreover, ISINK can be obtained from the reference voltage, Vref, and a precision resistor such as an off-chip resistor, Rext. Thus, ISINK=Vref/Rext. If such a configuration is used, then the frequency would be equal to, F=1/(2*k*C1*Rext). Thus, the frequency can be inversely proportional to the value of an on-chip capacitor 118 and an off-chip resistor, Rext. The reference voltage, Vref, is no longer part of the frequency expression. Since an off-chip resistor can be more resistant to process and temperature variations, the improved relaxation oscillator circuit of FIG. 3 will have better process and temperature independence over the relaxation oscillator circuit of FIG. 1.

What is claimed is:

1. A relaxation oscillator circuit, comprising:
   a first current source (101) coupling a first voltage source (199) to a first node (VOR);
   a first transistor (110) having a drain connected to the first voltage source (199), a gate forming a second node, and a source connected to the first node (VOR);
   a second current source (103) coupling the first voltage source (199) to a third node (VOL);
   a second transistor (114) having a drain connected to the first voltage source (199), a gate connected to the second node, and a source connected to the third node (VOL);
   a third transistor (112) having a drain connected to the first node (VOR), a gate connected to the third node (VOL), and a source forming a fourth node (VSR);
   a fourth transistor (116) having a drain connected to the third node (VOL), a gate connected to the first node (VOR), and a source forming a fifth node (VSL);
   a first current sink (105) coupling a second voltage source (198) to the fourth node (VSR);
   a second current sink (107) coupling the second voltage source (198) to the fifth node (VSL);

a capacitor (118) coupling the fourth node (VSR) to the fifth node (VSL);

a fifth transistor (130) having a drain connected to the first voltage source (199), a gate connected to the second node, and a source forming a sixth node;

a third current source (138) coupling the first voltage source (199) to the sixth node;

a third current sink (136) coupling the second voltage source (198) to the sixth node;

an amplifier (132) having an output connected to the second node, an inverting terminal connected to the sixth node, and a non-inverting terminal; and a third voltage source (134) coupling the non-inverting terminal of the amplifier (132) to the first voltage source (199);

said first and third nodes providing an output of the oscillator circuit.

2. The relaxation oscillator circuit of claim 1, wherein the current sunk by the first current sink (105) is approximately equal to the current sunk by the second current sink (107).

3. The relaxation oscillator circuit of claim 2, wherein the current sunk by the third current sink (136) is approximately equal to two times the current sunk by the first current sink (105).

4. The relaxation oscillator circuit of claim 1, wherein the maximum current provided by the first current source (101) is approximately equal to the maximum current provided by the second current source (103).

5. The relaxation oscillator circuit of claim 1, wherein the amplifier (132) is powered by a further voltage source.

6. A relaxation oscillator circuit, comprising:

a first current source (101) coupling a first voltage source (199) to a first node (VOR);

a first transistor (110) having a drain-source path coupling the first voltage source (199) to the first node (VOR), and having a gate forming a second node;

a second current source (103) coupling the first voltage source (199) to a third node (VOL);

a second transistor (114) having a drain-source path connecting the first voltage source (199) to the third node (VOL), and having a gate connected to the second node;

a third transistor (112) having a drain-source path connecting the first node (VOR) to a fourth node (VSR), and having a gate connected to the third node (VOL);

a fourth transistor (116) having a drain-source path coupling the third node (VOL) to a fifth node (VSL), and having a gate connected to the first node (VOR);

a first current sink (105) coupling a second voltage source (198) to the fourth node (VSR);

a second current sink (107) coupling the second voltage source (198) to the fifth node (VSL);

a capacitor (118) coupling the fourth node (VSR) to the fifth node (VSL);

a fifth transistor (130) having a drain-source path coupling the first voltage source (199) to a sixth node, and having a gate connected to the second node;

a third current source (138) coupling the first voltage source (199) to the sixth node;

a third current sink (136) coupling the second voltage source (198) to the sixth node;

an amplifier (132) having an output connected to the second node, an inverting terminal connected to the sixth node, and a non-inverting terminal; and a third voltage source (134) coupling the non-inverting terminal of the amplifier (132) to the first voltage source (199);

said first and third nodes providing an output of the oscillator circuit; and wherein said first through fifth transistors are either all NMOS transistors or all PMOS transistors.

7. The relaxation oscillator circuit of claim 6, wherein the current sunk by the first current sink (105) is approximately equal to the current sunk by the second current sink (107).

8. The relaxation oscillator circuit of claim 7, wherein the current sunk by the third current sink (136) is approximately equal to two times the current sunk by the first current sink (105).

9. The relaxation oscillator circuit of claim 6, wherein the first transistor (110), the second transistor (114), the third transistor (112), the fourth transistor (116), and the fifth transistor (130) are each a PMOS transistor.

10. The relaxation oscillator circuit of claim 6, wherein the first transistor (110), the second transistor (114), the third transistor (112), the fourth transistor (116), and the fifth transistor (130) are each a NMOS transistor.

11. A relaxation oscillator circuit, comprising:

a first current source (101) coupling a first voltage source (199) to a first node (VOR);

a first transistor (110) having a collector-emitter path connecting to the first voltage source (199) to the first node (VOR), and having a base forming a second node;

a second current source (103) coupling the first voltage source (199) to a third node (VOL);

a second transistor (114) having a collector-emitter path connecting the first voltage source (199) to the third node (VOL), and having a base connected to the second node;

a third transistor (112) having a collector-emitter path connecting the first node (VOR) to a fourth node (VSR), and having a base connected to the third node (VOL);

a fourth transistor (116) having a collector-emitter path connected to the third node (VOL) to a fifth node (VSL), and having a base connected to the first node (VOR);

a first current sink (105) coupling a second voltage source (198) to the fourth node (VSR);

a second current sink (107) coupling the second voltage source (198) to the fifth node (VSL);

a capacitor (118) coupling the fourth node (VSR) to the fifth node (VSL);

a fifth transistor (130) having a collector-emitter path connecting the first voltage source (199) to a sixth node, and having a base connected to the second node;

a third current source (130) coupling the first voltage source (199) to the sixth node;

a third current sink (136) coupling the second voltage source (198) to the sixth node;

an amplifier (132) having an output connected to the second node, an inverting terminal connected to the sixth node, and a non-inverting terminal; and a third voltage source (134) coupling the non-inverting terminal of the amplifier (132) to the first voltage source (199);

said first and third nodes providing an output of the oscillator circuit.

12. The relaxation oscillator circuit of claim 11, wherein the first transistor (110), the second transistor (114), the third transistor (112), the fourth transistor (116), and the fifth transistor (130) are pnp BJT transistors.

13. The relaxation oscillator circuit of claim 11, wherein the first transistor (110), the second transistor (114), the third transistor (112), the fourth transistor (116), and the fifth transistor (130) are npn BJT transistors.

14. A relaxation oscillator circuit, comprising:
a means for providing a voltage that oscillates between a first voltage level (VSUP) and a second voltage level (VSUP−VCLMP) offset from the first voltage level (VSUP) by a clamp voltage (VCLMP), the means for providing a voltage including a first transistor (110) connected between a voltage supply terminal (199) and a first output voltage signal node (VOR) of the relaxation oscillator circuit; and
a means coupled to the first transistor (110) for setting the clamp voltage to a value less than a diode voltage of a first transistor (110) controlling the voltage difference between the first voltage level and the second voltage level (134).

15. The relaxation oscillator circuit of claim 14, further comprising a means for controlling the period of oscillation (118 and ISINK).

16. The relaxation oscillator circuit of claim 14, wherein the means for providing a voltage further comprises:
a voltage source (134);
an amplifier having a first input coupled to the voltage source (134), a second input connected to a first node, and an output connected to drive a control input of the first transistor (110);
a second transistor (130) connected between a voltage supply terminal (199) and the first node, the first and second transistors having control inputs connected together.

17. The relaxation oscillator circuit of claim 16 wherein a first voltage swing on the first output voltage signal node (VOR) and a second voltage swing on a second output voltage signal node (VOL), the second voltage swing controlled by a third transistor (114) connected between the first voltage supply (199) and the second output voltage signal node (VOL) and having a control input connected to the output of the amplifier, are created as a function of the relaxation oscillator circuit.

18. The relaxation oscillator circuit of claim 17 wherein the second output voltage signal (VOL) is approximately one hundred eighty degrees phase shifted from the first output voltage signal (VOR).

19. A relaxation oscillator circuit, comprising:
a first current source (101) coupling a first voltage source (199) to a first node (VOR);
a first transistor (110) including a first terminal coupled with a second terminal forming a path coupling the first voltage source (199) to the first node (VOR), and a control terminal connected between the first terminal and the second terminal;
a second current source (103) coupling the first voltage source (199) to a third node (VOL);
a second transistor (114) including a first terminal coupled with a second terminal forming a path coupling the first voltage source (199) to the third node (VOL), and a control terminal connected between the first terminal and the second terminal;
a third transistor (112) including a first terminal coupled with a second terminal forming a path coupling the first node (VOR) to a fourth node (VSR), and a control terminal connected between the first node and the second node, the control terminal connected to the third node (VOL);
a fourth transistor (116) including a first terminal coupled with a second terminal forming a path coupling the third node (VOL) to a fifth node (VSL), and a control terminal connected between the first node and the second node, the control terminal connected to the first node (VOR);
a first current sink (105) coupling a second voltage source (198) to the fourth node (VSR);
a second current sink (107) coupling the second voltage source (198) to the fifth node (VSL);
a capacitor (118) coupling the fourth node (VSR) to the fifth node (VSL);
a fifth transistor (130) including a first terminal coupled with a second terminal forming a path coupling the first voltage source (199) to a sixth node, and a control terminal connected between the first node and the second node, the control terminal connected to the second node;
a third current source (138) coupling the first voltage source (199) to the sixth node;
a third current sink (136) coupling the second voltage source (198) to the sixth node;
an amplifier (132) having an output connected to the second node, an inverting terminal connected to the sixth node, and a non-inverting terminal; and
a third voltage source (134) coupling the non-inverting terminal of the amplifier (132) to the first voltage source (199);
said first and third nodes providing an output of the oscillator circuit;
wherein said first through fifth transistors are either all n-channel or all p-channel transistors.

20. The relaxation oscillator circuit of claim 19, wherein a width to length ratio of a channel between the source and drain of transistors forming the third current source (138), the third current sink (136) and the fifth transistor (130) may be proportionately scaled relative to other components in the relaxation oscillator circuit with voltages on the first node (VOR) and the second node (VOL) remaining substantially constant.

21. The relaxation oscillator circuit of claim 19, wherein the amplifier (132) receives power from a voltage source having a higher voltage than a voltage provided by the first voltage source (199), and the voltage at the output of the amplifier (132) can exceed the voltage provided at the first voltage source (199).

* * * * *